(12) United States Patent
Mo et al.

(10) Patent No.: US 9,161,435 B2
(45) Date of Patent: Oct. 13, 2015

(54) NETWORK SIGNAL PROCESSING CIRCUIT ASSEMBLY

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: AJOHO ENTERPRISE CO., LTD., Taipei (TW)

( * ) Notice: Subject to any disclaimer, the term of this patent is extended or adjusted under 35 U.S.C. 154(b) by 386 days.

(21) Appl. No.: 13/683,939

(22) Filed: Nov. 21, 2012

(65) Prior Publication Data

US 2014/0009239 A1 Jan. 9, 2014

Related U.S. Application Data

(63) Continuation-in-part of application No. 13/544,538, filed on Jul. 9, 2012, now Pat. No. 8,878,628.

(30) Foreign Application Priority Data

Sep. 14, 2012 (TW) .............................. 101217845 U (51) Int. Cl.
*H05K 1/02* (2006.01)
*H03H 7/00* (2006.01)

(52) U.S. Cl.
CPC ............ *H05K 1/0233* (2013.01); *H05K 1/0234* (2013.01); *H03H 7/004* (2013.01); *H05K 1/0245* (2013.01)

(58) Field of Classification Search
CPC . H05K 1/0234; H05K 1/0233; H05K 1/0245; H03H 7/004; H03H 7/38
USPC .............................. 333/1, 5, 12, 32, 181, 131
See application file for complete search history.

(56) References Cited

FOREIGN PATENT DOCUMENTS

TW             436860    *  9/2012 .............. G06F 13/38

* cited by examiner

*Primary Examiner* — Benny Lee
*Assistant Examiner* — Jorge Salazar, Jr.
(74) *Attorney, Agent, or Firm* — Muncy, Geissler, Olds & Lowe, P.C.

(57) ABSTRACT

A network signal processing circuit assembly includes a network-on-chip, a network connector, and a processing circuit including a plurality of channels respectively and electrically connected between the network-on-chip and the network connector, a plurality of signal coupling capacitors respectively electrically coupled to the channels, and a plurality of inductor sets electrically connected in parallel between the signal coupling capacitors and the network connector for causing a back-EMF (back-electro motive force) when receiving power supply from the signal coupling capacitors.

6 Claims, 10 Drawing Sheets

NETWORK SIGNAL PROCESSING CIRCUIT ASSEMBLY

This application is a Continuation-In-Part of application Ser. No. 13/544,538, filed on Jul. 9, 2012, now U.S. Pat. No. 8,878,628, for which priority is claimed under 35 U.S.C. §120; this application claims the priority benefit of Taiwan patent application number 101217845, filed on Sep. 14, 2012 under 35 U.S.C. §119 the entire contents of all of which are hereby incorporated by reference.

BACKGROUND OF THE INVENTION

1. Field of the Invention

The present invention relates to network technology and more particularly, to a network signal processing circuit assembly, which uses signal coupling capacitors for causing a back-EMF (back-electro motive force) to increase the voltage difference, ensuring signal integrity and reliability, avoiding signal distortion and saving power loss.

2. Description of the Related Art

Following fast development of computer technology, desk computers and notebook computers are well developed and widely used in different fields for different applications. It is the market trend to provide computers having high operating speed and small size. Further, network communication technology brings people closer, helping people to gather information about living, learning, working and recreational activities. By means of network communication, people can communicate with one another to send real time information, advertising propaganda or e-mail. Further, through the Internet, people can search information, send instant messages, or play on-line video games. The development of computer technology makes the relationship between people and network unshakable and inseparable.

Figure 7:
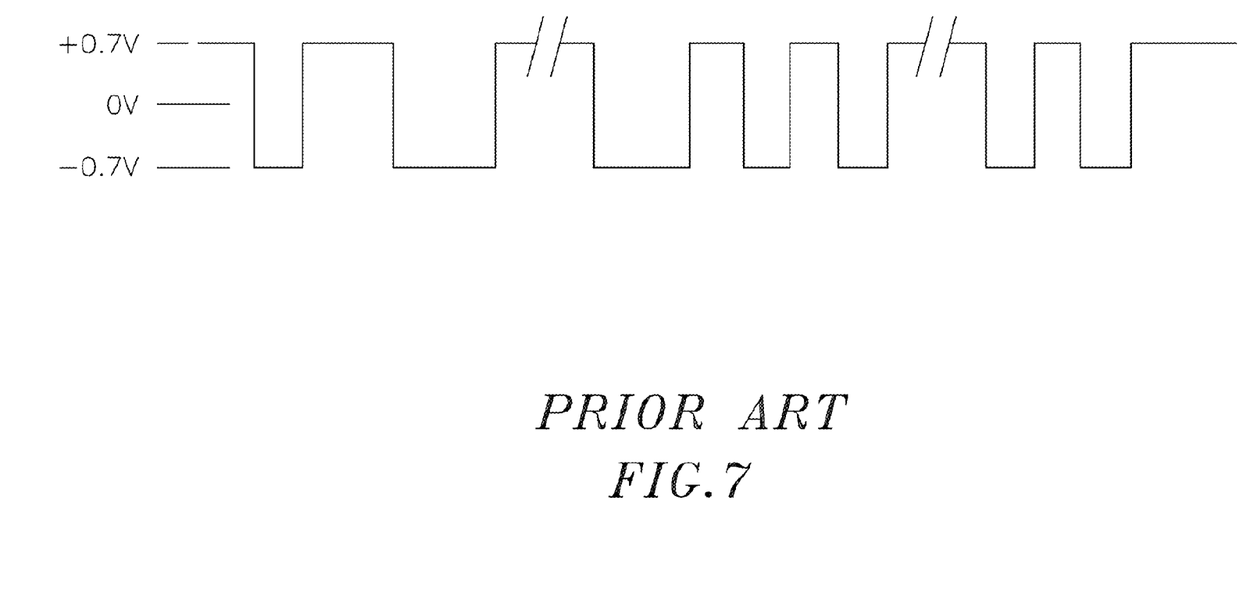
FIG. 7 is a signal waveform curve obtained under transmission speed 10 Mbps according to the prior art design.

Connecting a computer or electronic apparatus to a network for data transmission can be done by a cable connection technique or a wireless transmission protocol. A cable connection technique needs the installation of a network connector. Further, following the development of network application technology, network data transmission capacity has been greatly increased. To satisfy the demand for high data transmission capacity, network transmission speed has been greatly improved from the early 10 Mbps to 100 Mbps or 1 Gbps. Nowadays, fiber-optic network transmission speed can be as high as 10 Gbps and up. When under the network transmission speed of 10 Mbps, Manchester coding is adopted. Because the waveform of the signal being transmitted through the cable at 10 Mbps is symmetric (see FIG. 7), in case of signal distortion or signal error, signal compensation can be performed using this symmetric characteristic, obtaining integral and accurate signal data. When under the network transmission speed of 100 Mbps, 3-level ternary code is used. This 3-level ternary code is to cut out bitstream into 8-bit bytes, enabling each 8-bit byte to be converted into a respective 6-symbol codeword. Thus, the required clock frequency can be reduced from 33.3 MHz to 25 MHz without surpassing the tolerable limit of 30 MHz of a double twisted cable.

Figure 8:
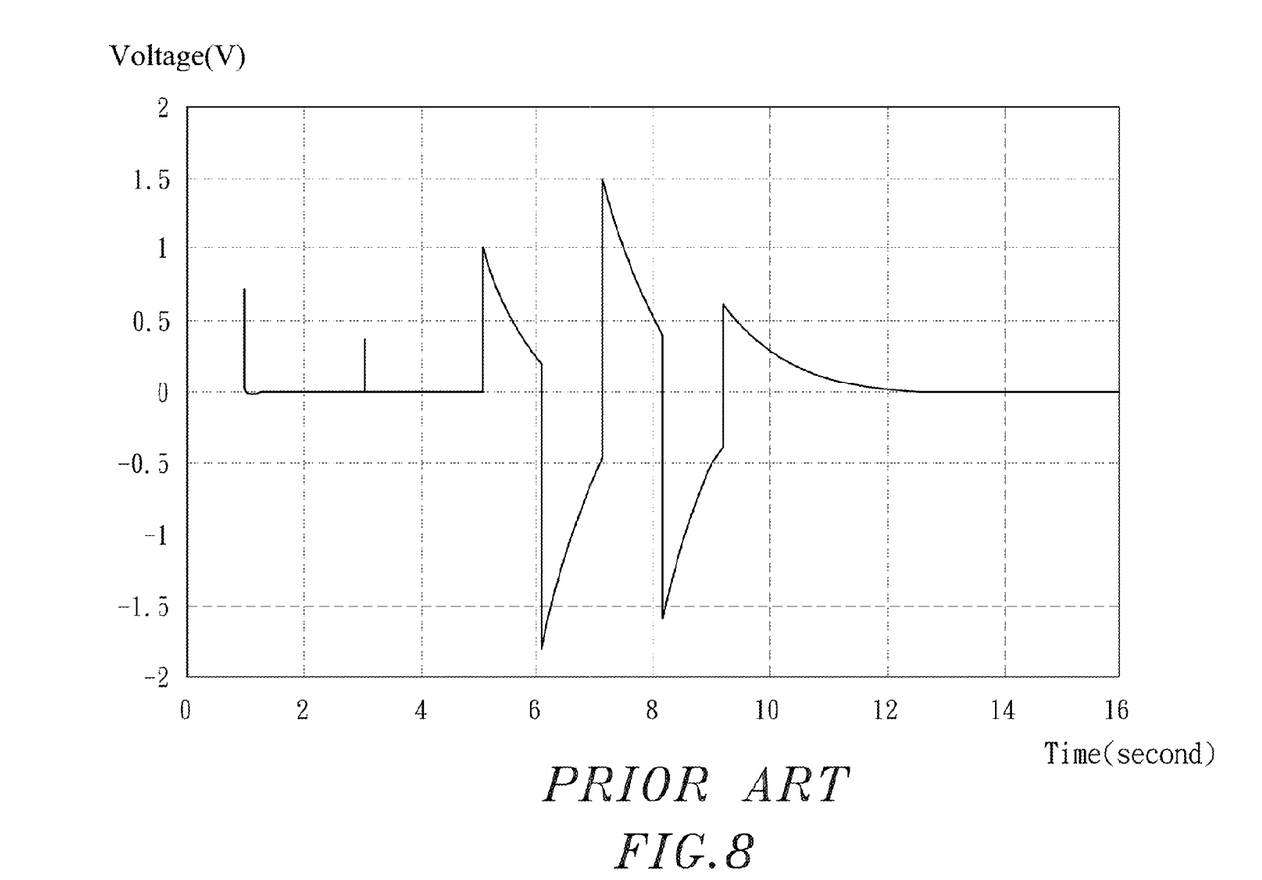
FIG. 8 is a signal waveform curve obtained under transmission speed 1 Gbps according to the prior art design.

However, when under the network transmission speed of 1 Gbps, the clock frequency is 125 MHz, and the 4D-PAM5 code is used. According to this 4D-PAM5 code, each level represents a symbol, and each symbol represents a 2-bits data. Thus, signal can be greatly compressed to enhance the transmission speed. However, the waveform of this signal is asymmetric (see FIG. 8). In order to prevent distortion or failure due to removal of network signal (the part of negative voltage), a bias must be provided, enabling signal to be smoothly transmitted in the positive voltage.

Figure 9:
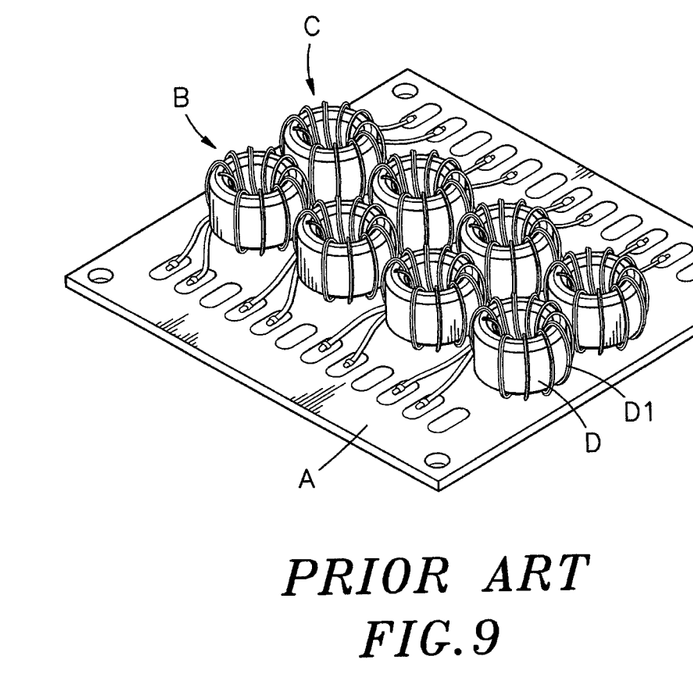
FIG. 9 is an elevational view of a network signal processing circuit assembly according to the prior art.

A conventional network connector has built therein transformer modules and common-mode suppression modules. As shown in FIG. 9, a conventional network connector comprises a circuit board A, and multiple transformer coils B and filter coils C installed in the circuit board A. The transformer coils B and the filter coils C each comprise a wire core D, and a lead wire D1 wound round the wire core D with the ends thereof bonded to respective contacts at the circuit board A. Because the winding of the transformer coils B and the filter coils C cannot be achieved by an automatic machine and must be done by labor, the fabrication efficiency of this kind of network connector is low. Further, the lead wire may be broken easily during winding, thereby increasing the cost. Further, fabrication by labor cannot accurately control the coil winding tightness and number of turns, affecting product quality stability.

Figure 10:
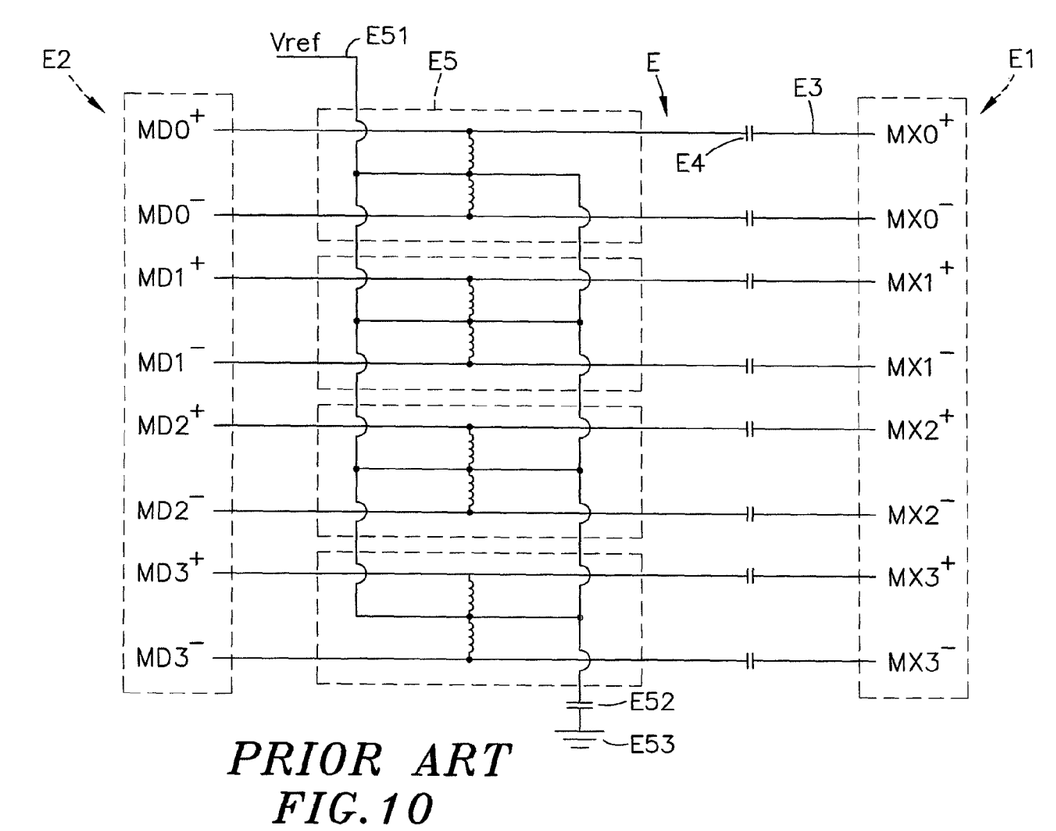
FIG. 10 is a simple circuit diagram of another network signal processing circuit assembly according to the prior art.

Further, Taiwan Patent Application 101207955, or the Patent Number M436860 published on Patent Gazette on Sep. 1, 2012, issued to the present inventor, discloses a network signal processing circuit. According to this design, as shown in FIG. 10, the network signal processing circuit, referenced by E, has its two opposite ends respectively electrically connected to a network connector E1 and a network-on-chip E2. The network signal processing circuit E comprises a plurality of channels E3, a plurality of signal coupling capacitors E4 respectively coupled to the channels E3, and a plurality of inductors E5 electrically connected in series to the signal coupling capacitors E4. The inductors E5 are electrically connected to a bias providing terminal E51, a voltage stabilizing capacitor E52 and a grounding terminal E53. The bias providing terminal E51 provides a DC voltage level through the inductors E5 to the channels E3, keeping the signals being transmitted through the channels E3 within the positive voltage range. Therefore, signals being transmitted through the channels E3 will not be cut off, avoiding distortion and ensuring signal integrality. Further, the inductors E5 has the characteristics of being in an open circuit to DC voltage and close circuit to AC high-frequency signal. When the bias providing terminal E51 provides a DC voltage level to the inductors E5, the inductance value will be lowered for enabling the bias voltage to pass, isolating the high-frequency network signal, and therefore voltage signal can simply be transmitted through the channels E3 and will not be shunted to the ground. Further, the voltage stabilizing capacitor E52 and the grounding terminal E53 can balance the voltage value of the channels E3. However, voltage stabilizing capacitor E52 and the grounding terminal E53 will also cause the power supply provided by the bias providing terminal E51 to be grounded, causing a significant power loss.

Therefore, there is a strong demand for a network signal processing circuit assembly, which eliminates the drawbacks of the aforesaid prior art designs.

SUMMARY OF THE INVENTION

The present invention has been accomplished under the circumstances in view. It is therefore the main object of the present invention to provide a network signal processing circuit assembly, which is capable of causing a back-EMF (back-electro motive force) to increase the voltage difference, ensuring signal integrity and reliability, avoiding signal distortion and saving power loss.

To achieve this and other objects of the present invention, a network signal processing circuit assembly comprises a network-on-chip, a network connector, and a processing circuit.

The network-on-chip comprises a pin set for transmitting electronic and voltage signals. The network connector comprises a pin set corresponding to the pin set of the network-on-chip for transmitting electronic and voltage signals. The processing circuit comprises a plurality of channels respectively and electrically connected between the pin set of the network-on-chip and the pin set of the network connector, a plurality of signal coupling capacitors respectively electrically coupled to the channels, and a plurality of inductor sets electrically connected in parallel between the signal coupling capacitors and the network connector for causing a back-EMF (back-electro motive force) when receiving power supply from the signal coupling capacitors. Further, the network-on-chip has built therein a power supply circuit adapted to provide power supply to the signal coupling capacitors.

The processing circuit further comprises a plurality of resistor sets electrically connected in parallel to the channels between the pin set of the network-on-chip and the pin set of the network connector. Each resistor set comprises a plurality of resistors connected in series. The network signal processing circuit assembly further comprises a grounding terminal for grounding, and a voltage stabilizing capacitor electrically connecting the resistors of each of the resistor sets to the grounding terminal.

DETAILED DESCRIPTION OF THE PREFERRED EMBODIMENT

Referring to FIGS. 1-4, a network signal processing circuit assembly in accordance with the present invention is shown. The network signal processing circuit assembly comprises a network-on-chip 1, a network connector 2, and a processing circuit 3 electrically connected between the network-on-chip 1, a network connector 2.

Figure 1:
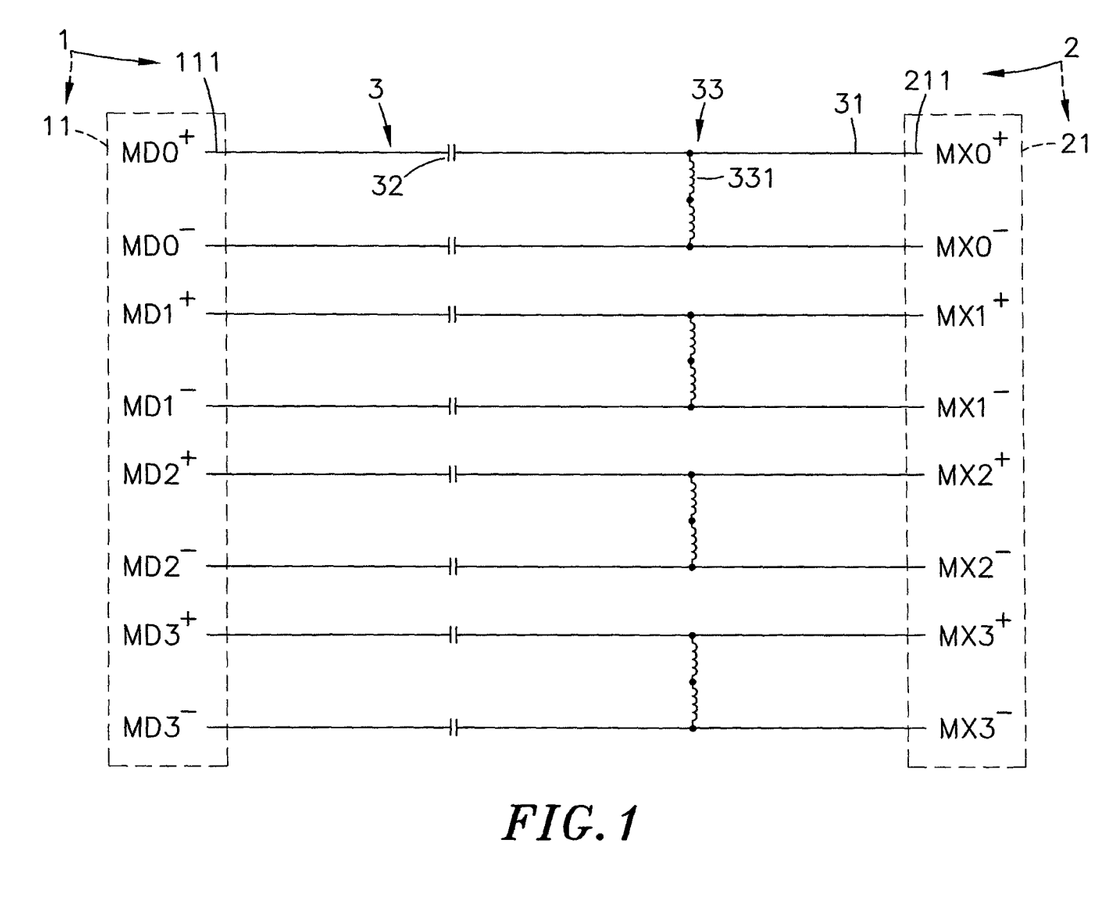
FIG. 1 is a simple circuit diagram of a network signal processing circuit assembly in accordance with the present invention.

The network-on-chip 1 in FIG. 1 comprises a pin set 11 for transmitting electronic and voltage signals. The network connector 2 comprises a pin set 21 corresponding to the pin set 11 of the network-on-chip 1 for transmitting electronic and voltage signals. The processing circuit 3 comprises a plurality of channels 31 respectively and electrically connected between the pin set 11 of the network-on-chip 1 and the pin set 21 of the network connector 2, a plurality of signal coupling capacitors 32 respectively electrically coupled to the channels 31, and a plurality of inductor sets 33 electrically connected in parallel between the signal coupling capacitors 32 at the channels 31 and the network connector 2. Each inductor set 33 comprises a plurality of inductors 331 connected in series.

The network-on-chip 1 has built therein a power supply circuit adapted to provide power supply to the signal coupling capacitors 32. The signal coupling capacitors 32 remove direct current and provide AC current to the inductor sets 33. As stated above, each inductor set 33 comprises a plurality of inductors 331 connected in series, and the inductor sets 33 are electrically connected in parallel between the signal coupling capacitors 32 and the network connector 2. When the signal coupling capacitors 32 are providing AC current to the inductor sets 33, a back-EMF (back-electro motive force) is produced to increase the voltage difference, enabling the power supply to be transmitted through the channels 31 to the pin set 11 of the network-on-chip 1. Thus, an electric current signal can be stably and reliably transmitted from the network-on-chip 1 to the network connector 2 through the processing circuit 3, avoiding signal distortion and saving power loss.

Further, because the invention eliminates any bias supply terminal means to provide power supply among the channels 31 of the processing circuit 3, no electric current will go through the inductors 331 of the inductor sets 33. Thus, the material properties of the inductors 331 do not affect the inductance of the inductors 331, ensuring the integrality and reliability of the signals being transmitted through the channels 31.

Figure 2:
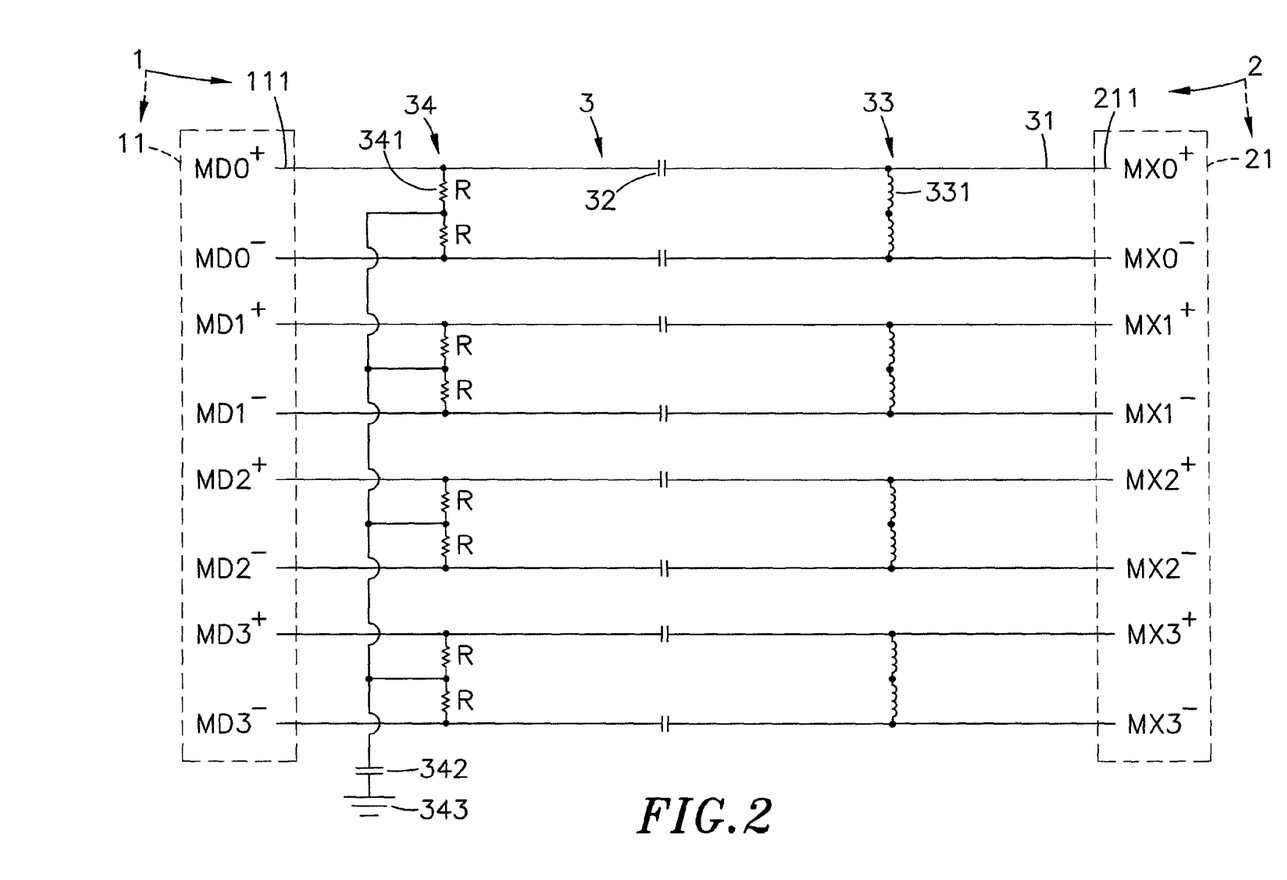
FIG. 2 illustrates an alternate form of the circuit diagram of the network signal processing circuit assembly in accordance with the present invention.

Further, resistor sets 34 as in FIG. 2 are electrically connected in parallel to the channels 31 of the processing circuit 3 between the pin set 11 of the network-on-chip 1 and the pin set 21 of the network connector 2. Each resistor set 34 comprises a plurality of resistors 341 connected in series. The connection point between each two adjacent resistors 341 of each of the resistor sets 34 is electrically connected to a voltage stabilizing capacitor 342 and then a grounding terminal 343.

The aforesaid resistor sets 34 are simply for impedance matching. The aforesaid voltage stabilizing capacitor 342 is adapted to remove noises or surges, maintaining signal transmission stability through the channels 31.

Further, the pins 111 of the pin set 11 of the network-on-chip 1 are configured to be MD0$^+$, MD0$^-$, MD1$^+$, MD1$^-$, MD2$^+$, MD2$^-$, MD3$^+$ and MD3$^-$. However, this configuration layout is changeable to fit different design requirements. Further, the pins 211 of the pin set 21 of the network connector 2 are configured to be MX0$^+$, MX0$^-$, MX1$^+$, MX1$^-$, MX2$^+$, MX2$^-$, MX3$^+$ and MX3$^-$. However, this configuration layout is changeable to fit different design requirements.

Figure 3:
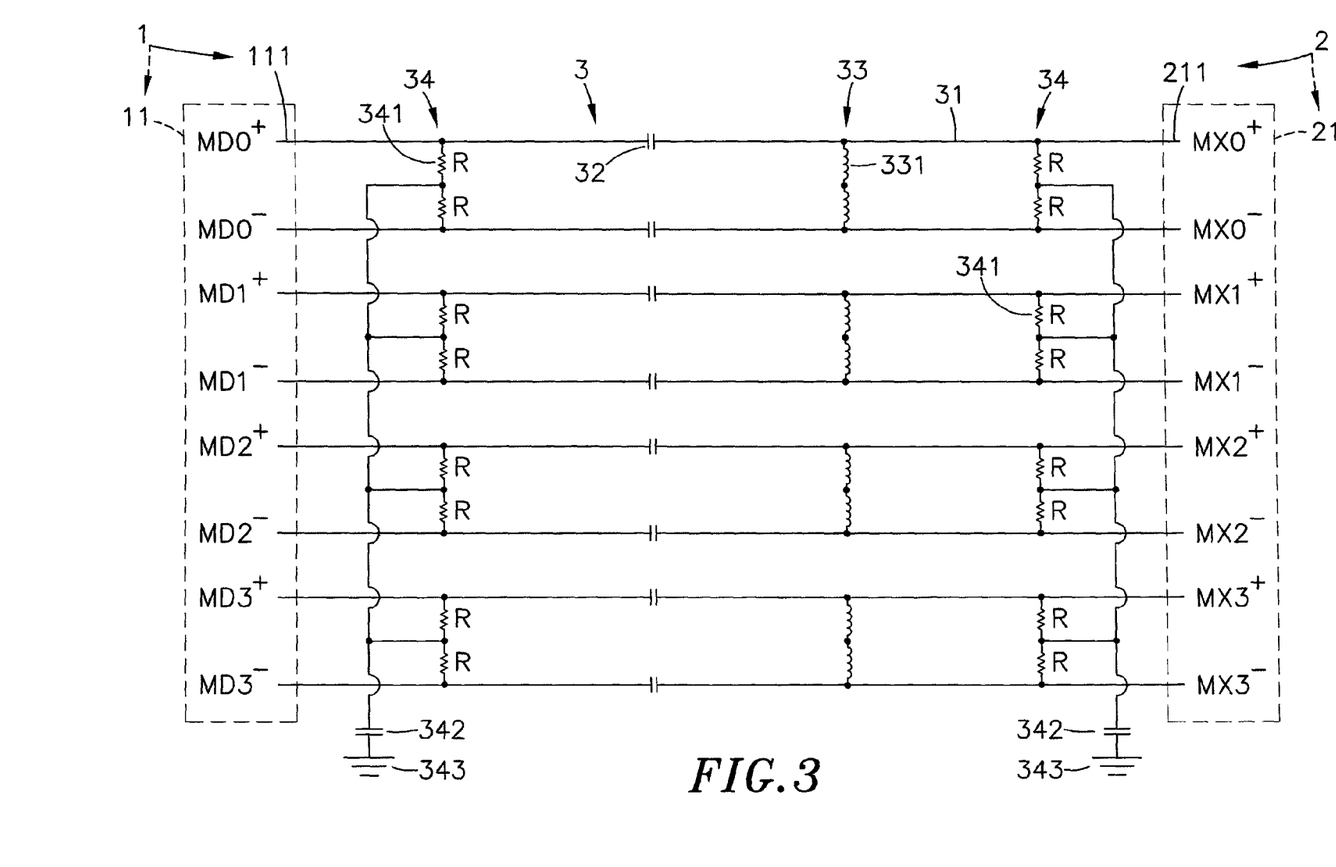
FIG. 3 illustrates another alternate form of the circuit diagram of the network signal processing circuit assembly in accordance with the present invention.
Figure 4:
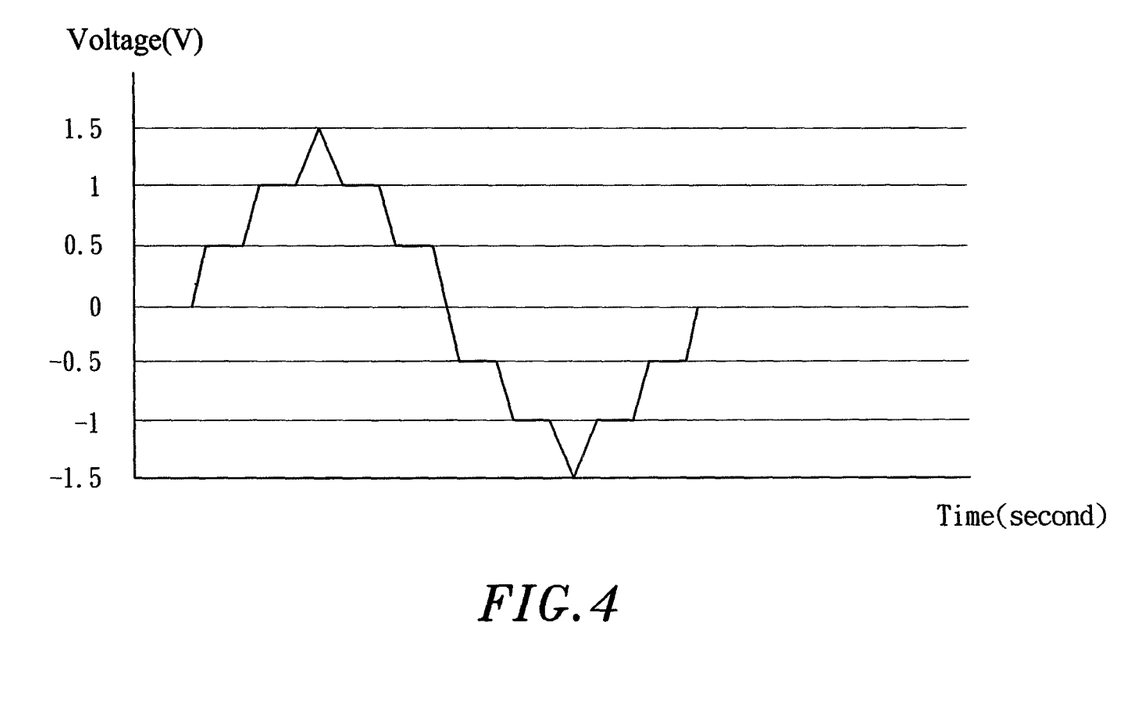
FIG. 4 is a signal waveform curve obtained according to the invention.

Further, as stated above, the series of resistors 341 of the resistor sets 34 in FIG. 3 are electrically connected to the grounding terminal 343 through the voltage stabilizing capacitor 342. However, due to the manufacturing tolerance of the resistors 341, the voltage value at MD$^+$ and the voltage value at MD$^-$ may be different. The voltage stabilizing capacitor 342 is adapted to balance the voltage values between MD$^+$ and M$^-$. In actual application, the level of the central voltage will float up and down, causing signal distortion. The invention uses the voltage stabilizing capacitor 342 to automatically adjust the voltage to the accurate level as in FIG. 4, ensuring the integrality and reliability of the received signal.

Figure 5:
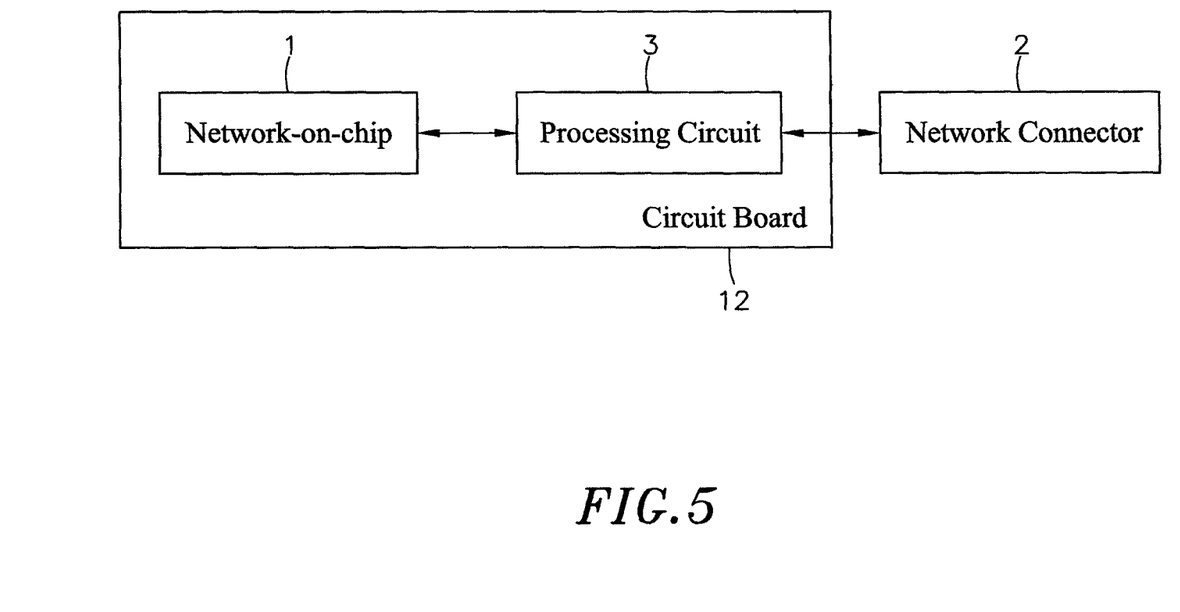
FIG. 5 is a circuit block diagram illustrating one application example of the present invention.
Figure 6:
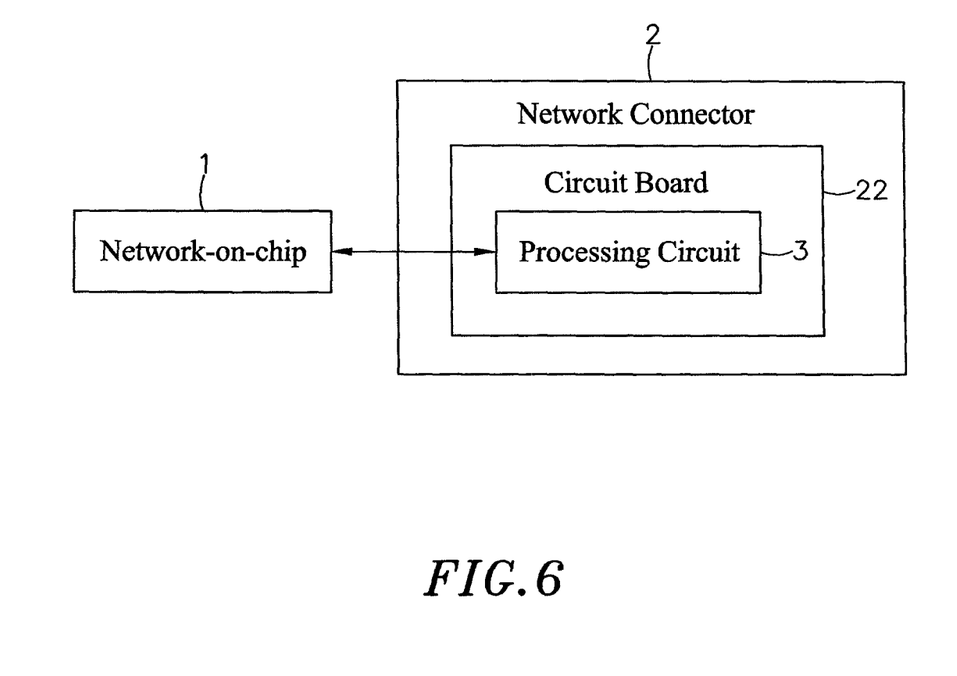
FIG. 6 is a circuit block diagram illustrating another application example of the present invention.

Referring to FIGS. 5 and 6, the processing circuit 3 can be directly installed in a circuit board 12 that carries the network-on-chip 1, and then electrically connected to the pin set 21 of the network connector 2. The circuit board 12 provides the network-on-chip 1 with the necessary working voltage. Further, the circuit board 12 can be equipped with a power source (dry battery, rechargeable battery, lithium-ion battery or button battery, or electrically connected to city power supply through a power adapter cable to obtain the necessary working power supply. Alternatively, the processing circuit 3 can be installed in a circuit board 22 in the network connector 2, and the network-on-chip 1 can be installed in an external circuit board (not shown) that is electrically connected to processing circuit 3.

In actual application, the invention has the advantages and features as follows:

1. By means of coupling the signal coupling capacitors 32 to the channels 31 of the processing circuit 3 between the pin set 11 of the network-on-chip 1 and the pin set 21 of the network connector 2 and connecting the inductor sets 33 in parallel between the signal coupling capacitors 32 at the channels 31 and the network connector 2, a back-EMF (back-electro motive force) can be produced to increase the voltage difference during supply of AC current by the signal coupling capacitors 32 to the inductor sets 33, ensuring signal integrality and reliability and saving power loss.

2. Subject to the design that each inductor set 33 comprises a plurality of inductors 331 connected in series and the design of electrically connecting the inductor sets 33 in parallel between the signal coupling capacitors 32 and the network connector 2, a back-EMF (back-electro motive force) can be produced to increase the voltage difference during supplying of AC current by the signal coupling capacitors 32 to the inductor sets 33, ensuring signal integrality and reliability and avoiding signal distortion.

In conclusion, the invention provides a network signal processing circuit assembly, which comprises a network-on-chip 1 comprising a pin set 11 for transmitting electronic and voltage signals, a network connector 2 comprising a pin set 21 corresponding to the pin set 11 of the network-on-chip 1 for transmitting electronic and voltage signals, and a processing circuit 3 comprising a plurality of channels 31 respectively and electrically connected between the pin set 11 of the network-on-chip 1 and the pin set 21 of the network connector 2, a plurality of signal coupling capacitors 32 respectively electrically coupled to the channels 31, and a plurality of inductor sets 33 electrically connected in parallel between the signal coupling capacitors 32 at the channels 31 and the network connector 2. During operation, the network-on-chip 1 provides power supply to the signal coupling capacitors 32, and the signal coupling capacitors 32 remove direct current and provide AC current to the inductor sets 33, ensuring signal integrality and reliability and avoiding signal distortion.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A network signal processing circuit assembly, comprising a network-on-chip, said network-on-chip comprising a pin set for transmitting electronic and voltage signals, a network connector, said network connector comprising a pin set corresponding to the pin set of said network-on-chip for transmitting electronic and voltage signals, and a processing circuit, said processing circuit comprising a plurality of channels respectively and electrically connected between the pin set of said network-on-chip and the pin set of said network connector and a plurality of signal coupling capacitors respectively electrically coupled to said plurality of channels, wherein said network-on-chip has built therein a power supply circuit adapted to provide power supply to said plurality of signal coupling capacitors; said processing circuit further comprises a plurality of inductor sets electrically connected in parallel between said signal coupling capacitors and said network connector for causing a back-EMF (back-electro motive force).

2. The network signal processing circuit assembly as claimed in claim 1, wherein each of said plurality of inductor sets comprises two inductors connected in series.

3. The network signal processing circuit assembly as claimed in claim 1, wherein said processing circuit is installed in a circuit board carrying said network-on-chip and then electrically connected to the pin set of said network connector, and the circuit board provides said network-on-chip with the necessary working voltage.

4. The network signal processing circuit assembly as claimed in claim 1, wherein said plurality of inductor sets cause a back-EMF (back-electro motive force) when receiving power supply from said plurality of signal coupling capacitors.

5. The network signal processing circuit assembly as claimed in claim 1, further comprising a plurality of resistor sets electrically connected in parallel to said plurality of channels of said processing circuit between the pin set of said network-on-chip and the pin set of said network connector, each of said plurality of resistor sets comprising a plurality of resistors connected in series, a grounding terminal for grounding, and a voltage stabilizing capacitor electrically connecting the resistors of each of said plurality of resistor sets to said grounding terminal.

6. The network signal processing circuit assembly as claimed in claim 1, wherein said plurality of signal coupling capacitors are adapted to remove direct current and to provide AC current to said plurality of inductor sets.

* * * * *